United States Patent [19]
Abe

[11] Patent Number: 5,815,536
[45] Date of Patent: Sep. 29, 1998

[54] MULTIVALUE DIGITAL TRANSMISSION SYSTEM

[75] Inventor: Yoshinori Abe, Tokyo, Japan

[73] Assignee: Pioneer Electronic Corporation, Tokyo, Japan

[21] Appl. No.: 856,483

[22] Filed: May 14, 1997

[30] Foreign Application Priority Data

May 17, 1996 [JP] Japan ..................................... 8-123707

[51] Int. Cl.$^6$ .................................................. H04L 27/06
[52] U.S. Cl. ........................ 375/344; 375/345; 455/234.1
[58] Field of Search ..................................... 375/344, 345, 375/340, 261, 298, 279, 280, 281, 308, 331, 339; 455/232.1, 234.1

[56] References Cited

U.S. PATENT DOCUMENTS

| | | | |
|---|---|---|---|
| 4,599,732 | 7/1986 | LeFever | 375/13 |
| 4,953,182 | 8/1990 | Chung | 375/345 |
| 4,955,077 | 9/1990 | Sugayama | 455/234 |
| 5,020,147 | 5/1991 | Okanobu | 455/234 |
| 5,400,366 | 3/1995 | Iwamatsu | 375/95 |
| 5,621,483 | 4/1997 | Krishnamurthy et al. | 375/327 |
| 5,621,767 | 4/1997 | Brandt et al. | 375/344 |
| 5,646,935 | 7/1997 | Ishikawa et al. | 375/261 |
| 5,671,253 | 9/1997 | Stewart | 375/316 |

*Primary Examiner*—Chi H. Pham
*Assistant Examiner*—Emmanuel Bayard
*Attorney, Agent, or Firm*—Morgan, Lewis & Bockius LLP

[57] ABSTRACT

A multivalue digital transmission system performs a stable AGC operation. The system performs the operations of: converting information data to be transmitted into a multivalue symbol sequence; adding an area comprising a binary symbol sequence, which does not depend on the information data, to the multivalue symbol sequence in a periodic manner, and transmitting a resultant signal after converting it to a multivalue digital modulation signal; detecting the binary symbol area from a demodulation signal obtained by demodulating an IF signal converted from the multivalue digital modulation signal; and performing a gain control of the IF signal based on a signal level of the demodulation signal obtained during a detection period of said binary symbol area.

8 Claims, 5 Drawing Sheets

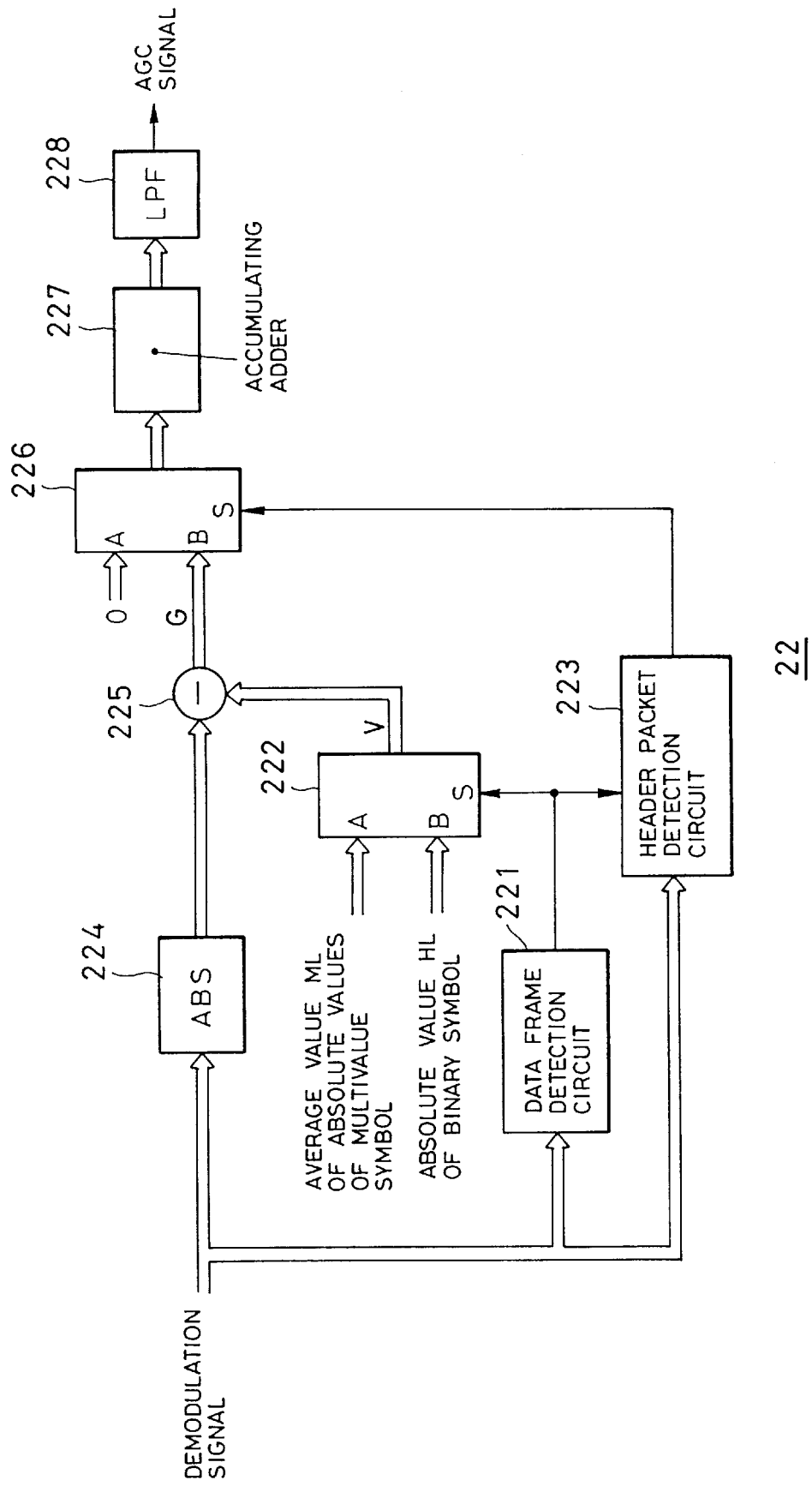

MULTIVALUE DIGITAL TRANSMISSION SYSTEM

BACKGROUND OF THE INVENTION

1. Field of the Invention

The invention relates to a multivalue digital transmission system.

2. Description of Related Art

Multivalue digital modulation methods such as VSB (vestigial sideband) modulation, and Multivalue QAM (quadrature amplitude modulation) are known as the modulation method for digitally transmitting information data such as video signal and audio signal. Instead of transmitting digital information data directly on a waveform signal having logical "1"s and "0"s, the digital information data to be transmitted is modulated by the multivalue digital modulation into a waveform signal corresponding to a plurality of levels and is then transmitted, thereby to accomplish transmission of more information in the same transmission band.

FIG. 1 shows a transmission and receiving system where 16-value VSB is adopted, as the multivalue digital modulation scheme, for the transmission of information data.

In FIG. 1, a 16-value VSB modulator 20 as a transmission system, converts coded information data (for instance, error correction coded information data) to be transmitted into a real number value symbol sequence $\{a_k\}$ every four bits. Arbitrary one symbol of the real number value symbol sequence has any one of 16 kinds of real number values. One among the 16 values used is determined by a combination of the 4-bit data. The 16-value VSB modulator 20 then converts the real number value symbol sequence $\{a_k\}$ into a 16-value VSB modulation signal r(t) by processes which are expressed by the following equations.

$$g(t) = \sum_{k=-\infty}^{\infty} a_k \cdot y(t - k \cdot T) \quad T = 1/f_s \tag{1}$$

$$r(t) = \text{real}[g(t) \cdot \exp\{j(2\pi \cdot f_c \cdot t + \theta)\}] \tag{2}$$

where j: imaginary number unit
$a_k$: transmission symbol sequence
y(t): transmission VSB pulse
g(t): base band VSB modulation signal
T: transmission symbol period
fs: transmission symbol frequency
real[ ]: real part of complex signal in parentheses
fc: carrier frequency As expressed by the above equations (1) and (2), the amplitude level of the 16-value VSB modulation signal r(t) becomes a level according to the real number value symbol sequence $\{a_k\}$.

The 16-value VSB modulator 20 transmits the 16-value VSB modulation signal on the transmission media 15. A tuner 1 receives the 16-value VSB modulation signal transmitted through the transmission media, and converts the signal into an IF (intermediate frequency) signal while adjusting its local oscillating frequency in accordance with a phase error signal which is supplied from a phase error detecting circuit 3, which will be explained later. The tuner 1 also adjusts a gain of the IF signal in accordance with an AGC signal which is supplied from an AGC (automatic gain control) circuit 2, which will be explained later. A Nyquist filter 4 performs pulse shaping of the IF signal so that overall characteristics with the transmission VSB pulse y(t) become Nyquist characteristics and supplies the pulse shaped signal to a quadrature detector 5. The quadrature detector 5 performs a complex frequency conversion of the IF signal which is waveform shaped by the Nyquist filter 4, thereby obtaining a complex base band signal. In the diagram, i and j denote a real part and an imaginary part of the complex base band signal, respectively. The phase error detecting circuit 3 estimates a phase angle of a multiplexed pilot from the complex base band signal and negatively feeds back an error between the estimated phase angle and a predetermined phase angle to a VCO in the tuner, thereby to execute a detecting operation without a phase error. An LPF (low pass filter) 6 supplies a signal obtained by removing unnecessary frequency components such as image spectrum and the like occurring in the process of the above-described detection from a real part signal in the complex base band signal, to each of the AGC 2, an A/D converter 7, and a timing recovery circuit 8 as the demodulation signal $F_i$.

The timing recovery circuit 8 extracts a timing clock signal synchronized with the transmission symbol frequency (fs=1/T) from the demodulation signal $F_i$ and supplies a sampling clock signal which is phase synchronized with the extracted timing clock signal to the A/D converter 7.

The A/D converter 7 samples the demodulation signal $F_i$ every sampling clock signal, thereby obtaining a digital received discrete time signal sequence. An equalizer 9 performs an equalizing process to the received discrete signal sequence, thereby outputting a received discrete time signal sequence in which an interference occurring in a transmission path, a distortion occurring in the apparatus, and the like are eliminated. A symbol value discriminating circuit 10 discriminates whether the received discrete time signal sequence which was subjected to the equalizing process corresponds to any one of the symbol values among 16 values and generates coded information data corresponding to the symbol value. By performing an error correction process to the coded information data at an error correcting circuit (not shown), transmitted information data is obtained.

The AGC circuit 2 generates an AGC signal according to an electric power difference between an average electric power of the demodulated signal $F_i$ and a predetermined reference electric power, and feeds back or supplies the AGC signal to the tuner 1. The tuner 1 performs the adjustment of the gain of the IF signal to be a gain corresponding to the AGC signal. Therefore, by the AGC circuit 2 described above, the gain control of the IF signal is performed in the way that a decrease of level is compensated even if the signal level of the transmitted 16 value VSB signal has been decreased.

However, in the event that a 16 value VSB signal in which the real number value symbol sequences $\{a_k\}$ having small absolute values are transmitted for a long time, the average electric power of the demodulation signal $F_i$ will be reduced irrespective of the amount of loss in the transmission media 15. Therefore, in such an event the AGC circuit 2 will perform an erroneous gain adjustment to raise the signal level of the IF signal.

As described above, there has been a problem that a stable AGC cannot be performed to a multivalue digital modulation signal whose signal level varies in response to the contents of the coded information data besides the amount of loss in the transmission media.

OBJECTS AND SUMMARY OF THE INVENTION

The invention is made to solve the problem described above, and it is an object of the invention to provide a multivalue digital transmission system which performs a stable AGC operation.

A multivalue digital transmission system according to the invention comprises: a multivalue modulator which converts information data to be transmitted into a multivalue symbol sequence consisting of multivalue symbols, adds a binary symbol area consisting of binary symbols to the multivalue symbol sequence in a periodic manner, and obtains a multivalue digital modulation signal by executing a multivalue digital modulation to a signal obtained by the addition of the binary symbol area to the multivalue symbol sequence; a tuner which converts the multivalue digital modulation signal into an IF signal at a gain according to an AGC signal; a demodulator which demodulates said IF signal by a demodulation process corresponding to the multivalue digital modulation to produce a demodulation signal; and an AGC circuit which detects the binary symbol area from the demodulation signal and produces the AGC signal based on a signal level of the demodulation signal obtained during a period of detection of the binary symbol area.

BRIEF DESCRIPTION OF THE DRAWINGS

FIG. 5 is a diagram showing an example of an internal structure of an AGC circuit 22.

DETAILED DESCRIPTION OF THE PREFERRED EMBODIMENT

Figure 1:
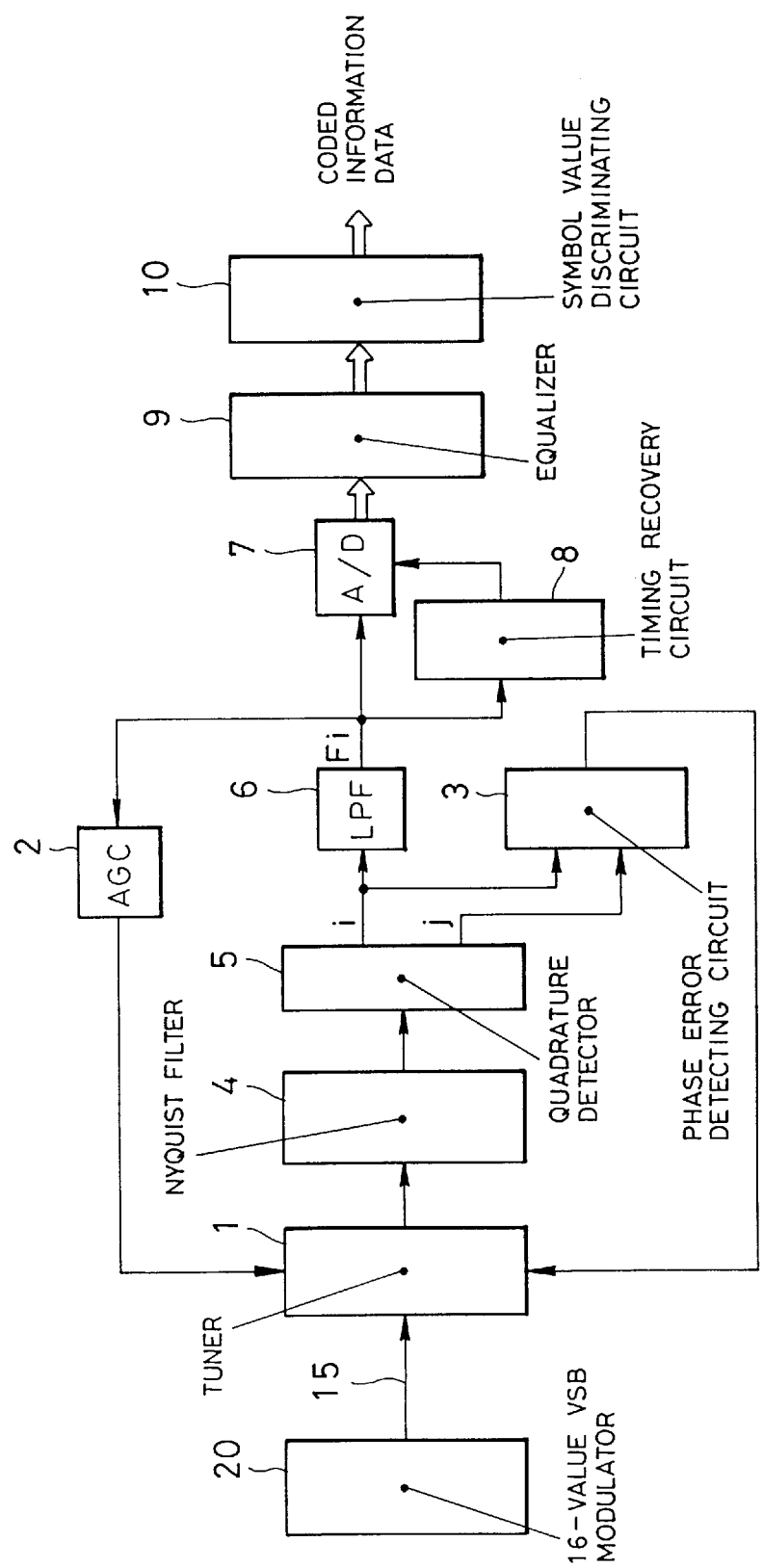
FIG. 1 is a diagram showing an example of a transmission and receiving system used in an information data transmitting scheme where a 16 value VSB modulation is adopted.
Figure 2:
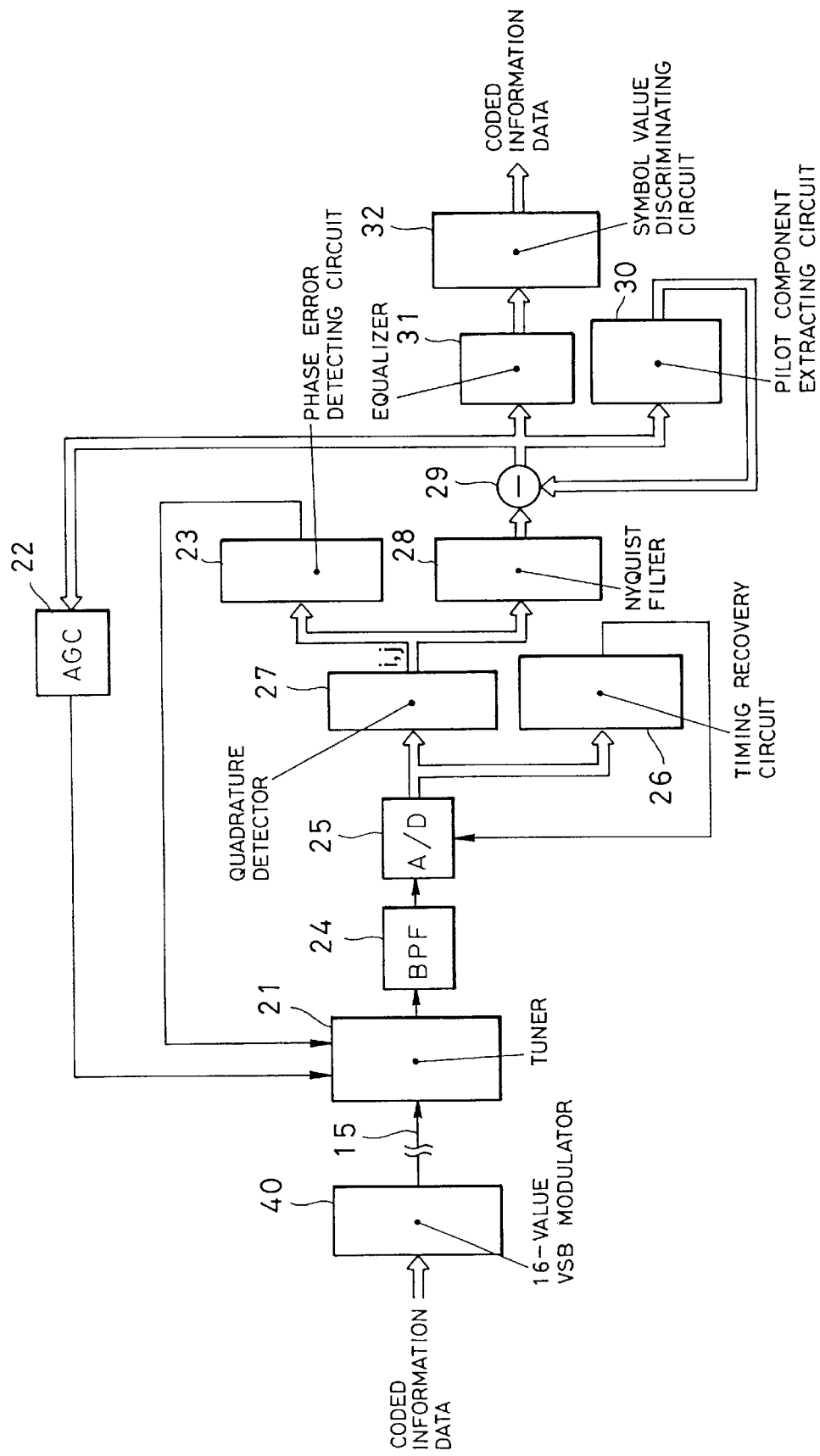
FIG. 2 is a diagram showing a multivalue digital transmission system according to the present invention.

FIG. 2 is a diagram showing the multivalue digital transmission system according to the invention.

In FIG. 2, a 16-value VSB modulator 40, equipped as a transmission system, converts a coded information data sequence (for example, error correction coded information data) to be transmitted into a symbol sequence of real number values, every four bits. One arbitrary symbol in the real number value symbol sequence has any one of 16 kinds of real number values. One of the 16 values used is determined by a combination of the 4-bit data. The 16-value VSB modulator 40 then generates a symbol sequence $a_k$ which is constituted by the data-frame format shown in FIG. 3.

Figure 3:
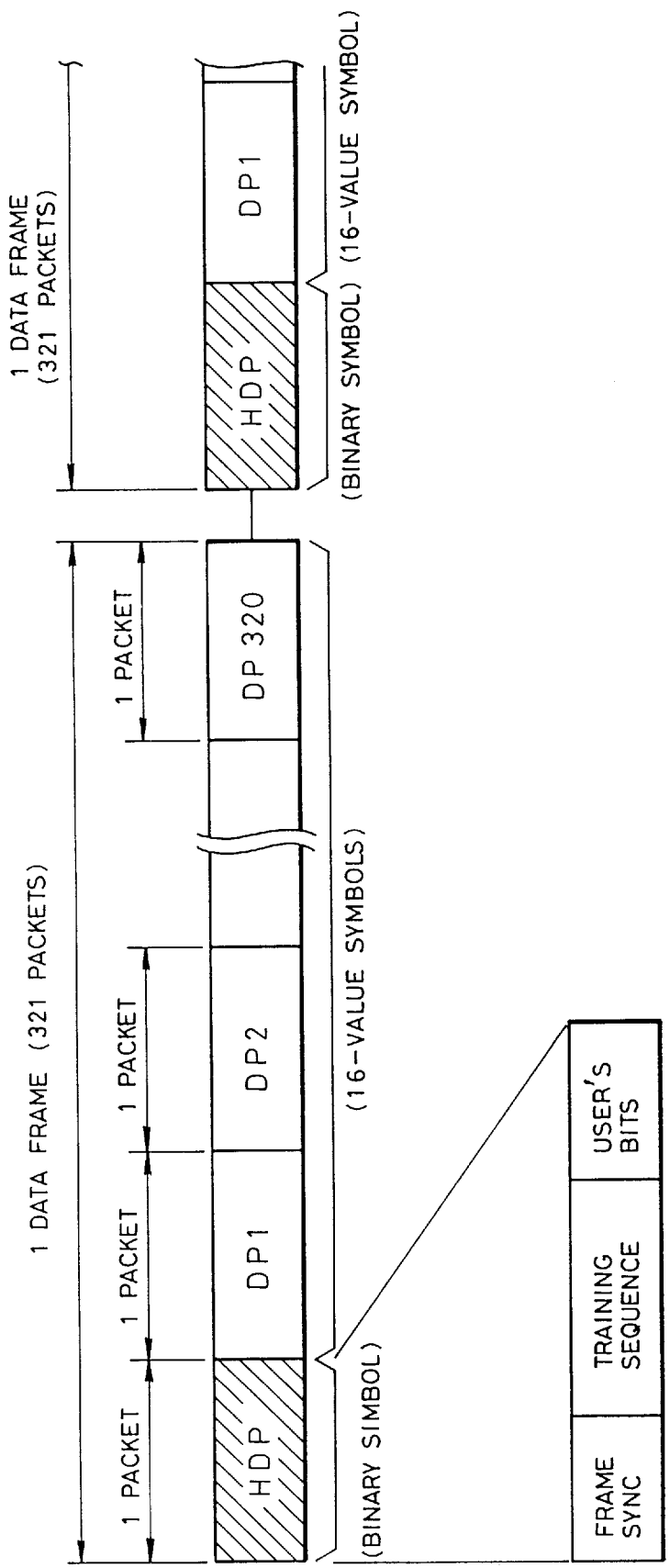
FIG. 3 is a diagram showing a data frame format.

As shown in FIG. 3, one data frame is made up of 321 packets having a header packet HDP, and data packets DP1 through DP320. Each data packet is made of 832 pieces of the symbol converted in the manner described above. At the head position of the data packets DP1 through DP320, there is provided the header packet HDP made up of a frame-sync part, a training sequence part, and a use's bit part. Each of the data packets DP1 through DP320 is made of 16-value symbols, whereas the header packet HDP is made of 2-value symbols.

For instance, each of the data packet DP1 through DP320 is formed by a symbol of 16 values {−15, −13, −11, −9, −7, −5, −3, −1, 1, 3, 5, 7, 9, 11, 13, 15}, and the header packet is made of a symbol of two values {−5, 5}.

Then the 16 value VSB modulator 40 then converts the symbol sequence $a_k$ into a 16-value VSB modulation signal f(t) by operating steps shown by the following equations. The obtained 16-value VSB modulation signal f(t) is transmitted to the transmission media 15.

$$g(t) = \sum_{k=-\infty}^{\infty} a_k \cdot y(t - k \cdot T) \quad T = 1/f_s \quad (3)$$

$$r(t) = \text{real}[g(t) \cdot \exp\{j(2\pi \cdot f_c \cdot t + \theta)\}] \quad (4)$$

where,
j: imaginary number unit
$a_k$: transmission symbol sequence
y(t): transmission VSB pulse
g(t): base band VSB modulation signal
fs: transmission symbol frequency
real []: real part of complex signal in parentheses
fc: carrier frequency A tuner 21 converts the above-mentioned 16 value VSB modulation signal, which is transmitted via the transmission media 15, into an IF (intermediate frequency) signal of a predetermined frequency while adjusting its local oscillating frequency in accordance with a phase error signal which is supplied from a phase error detecting circuit 23, which will be explained later. The tuner 21 also adjusts a gain of the IF signal in accordance with an AGC signal which is supplied from an AGC (automatic gain control) 22, which will be explained later. A BPF (band pass filter) 24 band limits the IF signal so that an A/D converter 25, which will be explained later, doesn't cause an aliasing at the time of the sampling operation. In other words, the BPF 24 extracts band components that do not cause aliasing at the A/D converter 25, and supplies the derived band limited IF signal to the A/D converter 25.

The A/D converter 25 samples the band limited IF signal every sampling clock which is supplied from a timing recovery circuit 26, which will be explained later, and supplies a digital IF sampled value sequence obtained by the sampling to each of the timing recovery circuit 26 and a quadrature detector 27. The timing recovery circuit 26 generates the sampling clocks of a predetermined frequency that are phase-compensated based on the above-described IF sampled value sequence, and supplies them to the A/D converter 25.

The quadrature detector 27 performs a complex frequency conversion to the IF sampled value sequence sampled as mentioned above, thereby obtaining a complex base band sequence. Namely, the quadrature detector 27 multiplies a complex exponential function sequence corresponding to the IF signal frequency $f_c$ to the IF sampled value sequence which is supplied, thereby obtaining the complex base band sequence C.

The phase error detecting circuit 23 estimates a phase angle of a multiplexed pilot from the complex base band sequence and negatively feeds back an error between the estimated phase angle and a predetermined phase angle to a VCO in the tuner 21, thereby to execute a detecting operation without a phase error. A Nyquist filter 28 is constructed by, for example, a complex coefficient FIR filter and performs a pulse shaping so that an overall characteristics with the above-described transmission VSB pulse y(t) become Nyquist characteristics. The Nyquist filter 28 supplies a discrete time signal sequence obtained by re-sampling a real part signal in the pulse shaped signal at a symbol rate, to a subtractor 29.

In other words, the structure including the quadrature detector 27 and the Nyquist filter 28 constitutes the 16 value VSB demodulator for performing a 16 value VSB modulation to the IF signal corresponding to the above-described 16 value VSB modulation signal having been transmitted, to obtain a demodulation signal. The demodulation signal has such a data frame format as that shown in FIG. 3.

The subtractor 29 supplies a signal obtained by subtracting a pilot component signal, which is supplied from the pilot component extracting circuit 30 described later, from the demodulation signal, to each of the pilot component extracting circuit 30, an equalizer 31, and an AGC circuit 22. The equalizer 31 performs an equalizing process to the demodulation signal from which the pilot component is removed, thereby supplying, to a symbol value discriminating circuit 32, a demodulation signal in which an interference occurring on a transmission media, a distortion occurring in the apparatus, and the like are eliminated. A symbol value discriminating circuit 32 discriminates to which one of multivalue (for example, 16 values) symbol values the demodulation signal which was subjected to the equalizing process corresponds, and outputs coded information data corresponding to the symbol value.

The pilot component extracting circuit 30 extracts a superimposed pilot component from the demodulation signal from which the pilot component has been removed at the above-described subtractor 29, and supplies, to the subtractor 29, a pilot component signal corresponding to the superimposed pilot component.

Figure 4:
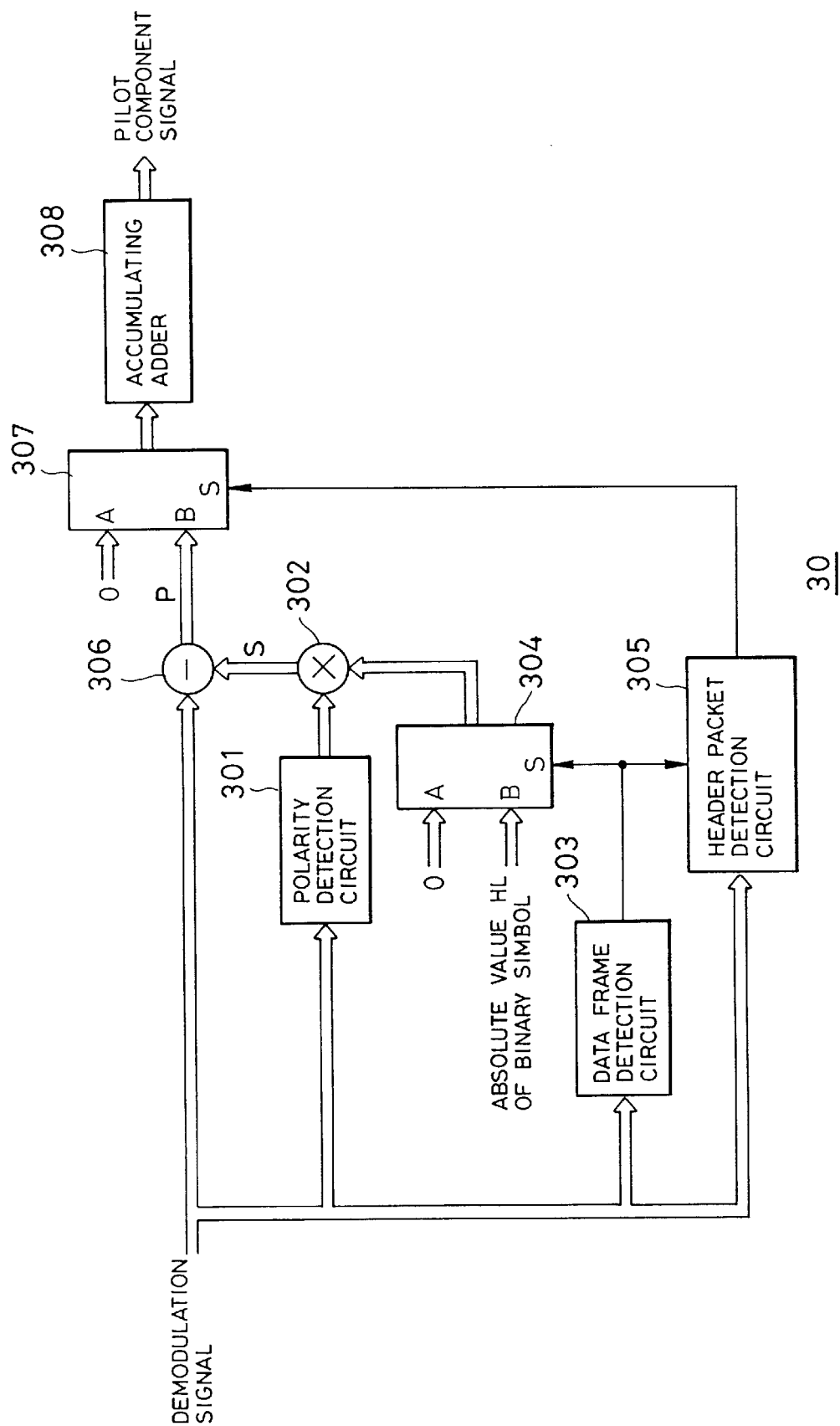
FIG. 4 is a diagram showing an example of an internal structure of a pilot component extracting circuit 30.

FIG. 4 is a diagram showing an internal construction of the pilot component extracting circuit.

In FIG. 4, a polarity detection circuit 301 detects the polarity of the demodulation signal with its pilot component eliminated at the subtractor 29. If the detected polarity is negative, a multiplication coefficient "−1" is supplied to a multiplier 302. If, on the other hand, the polarity is positive, a multiplication coefficient "1" is supplied to the multiplier 302.

A data frame detection circuit 303 detects whether or not the frame sync as shown in FIG. 3 is detected at predetermined intervals from the demodulation signal with its pilot component eliminated at the above-described subtractor 29, and supplies a frame stabilization detection signal to each of a selector 304 and a header packet detection circuit 305, the frame stabilization detection signal having a logical "1" when the frame sync is detected at the predetermined intervals, and a logical "0" when this detection of the frame sync is not made. In other words, the data frame detection circuit 303 functions as a means for detecting stabilization of 2-value symbol area, to detect whether or not a state that the header packet is obtained, as the 2-value symbol area, from the above-described demodulation signal in a stable manner has been established.

The selector 304 supplies a "0" level signal to the multiplier 302 when the frame stabilization detection signal of the logical value "0" is supplied from the data frame detection circuit 303, and supplies an absolute value HL of the binary symbol in the header packet HDP to the multiplier 302 when the frame stabilization detection signal of the logical value "1" is supplied. In other words, the selector 304 supplies the "0" level signal to the multiplier 302 when the header packet HDP, as the binary symbol area, is not obtained from the demodulation signal in a stable manner at the initial stage of the demodulation, and supplies the absolute value HL of the binary symbol to the multiplier 302 when the state that the header packet HDP is stably obtained has been established.

When the header packet HDP is made up of binary symbols of {−5, 5}, the level "5" 60 constitutes a high level HL.

The multiplier 302 multiplies the multiplication coefficient, which is supplied from the above-described polarity detection circuit 301, to the the value supplied from the selector 304, and supplies the resultant value to the subtractor 306 as a reference binary symbol value S. The subtractor 306 then subtracts the binary symbol value S from the above-described demodulation signal, and supplies the resultant signal to a selector 307 as a superposed pilot component signal P.

During the period in which the frame stabilization detection signal of logical "0" is supplied from the data frame detection circuit 303, the header packet detection circuit 305 supplies a pause signal of logical "1" to the selector 307. During the period in which the frame stabilization detection signal of logical "1" is supplied from the data frame detection circuit 303, the header packet detection circuit 305, on the other hand, performs a detection as to whether or not the header packet HDP shown in FIG. 3 is detected from the above-described demodulation signal. In the period in which the header packet HDP is not detected, the header packet detection circuit 305 supplies a pause signal of logical "0" to the selector 307, and in the period in which the header packet HDP is detected, the circuit 305 supplies a pause signal of logical "1" to the selector 307.

In other words, the header packet detection circuit 305 constitutes a binary symbol area detection means which starts the detection operation for detecting the header packet HDP as the binary symbol area from the demodulation signal when a state that the header packet HDP as the binary symbol area is stably obtained from the demodulation signal is attained.

In the period in which the pause signal of logical "0" is supplied, the selector 307 supplies a zero (0) level signal to an accumulating adder 308, and in the period in which the pause signal of logical "1" is supplied, the selector 307 supplies the above-described superposed pilot component signal P to the accumulating adder 308. The accumulating adder supplies a signal obtained by accumulatively adding the signal supplied from the selector 307 to the subtractor 29 shown in FIG. 2 as the pilot component signal.

With the structure described above, when the header packet HDP as the binary symbol area shown in FIG. 3 is not stably obtained, the output signal of the selector 307 becomes such a signal that the estimated pilot signal is eliminated from the demodulation signal sequence, the signal is then integrated at the accumulating adder 308 and the integrated signal is fed back to the pilot signal subtractor 29. With this scheme, a primary integration feedback loop is constituted in which a DC component of the output signal of the selector 307 is used as the error signal. In this configuration, an accurate elimination of pilot component is not achieved since the error signal of the feedback loop is affected by the DC components included in the transmitted symbol sequence.

When, on the other hand, the state that the header packet HDP is stably detected has been attained, the output signal of the selector 307 is integrated by the accumulating adder 308 only during the period of the superposition of the header packet HDP, and in the same period the output signal of the selector 307 becomes such a signal that the estimated value of the transmitted binary symbols is subtracted from the "signal obtained by eliminating the estimated pilot component from the demodulated signal sequence". In other words, during the period of the superposition of the header packet, the output signal of the selector 307 becomes a pure residual pilot component that is not affected by the DC components included in the transmitted symbol sequence. Therefore, by using this signal as an error signal, integrating it at the accumulating adder 308 only during the period of the superposition of the header packet, and feeding the integrated signal back to the pilot signal subtractor 29, to form the primary integration loop, an accurate elimination of the pilot component that is not affected by the DC components included in the transmitted symbol sequence itself is achieved.

By the above-described pilot component eliminating means constituted by the pilot component extracting circuit 30 and the subtractor 29, the pilot component can be eliminated from the demodulation signal with out being affected by the coded information data being transmitted, so that an accurate determination of symbols is performed at a symbol determination circuit 32 at the later stage.

The AGC circuit 22 shown in FIG. 2 generates an AGC signal to converge the demodulation signal within a predetermined level range based the on the demodulation signal that is obtained by eliminating the pilot component at the subtractor 29, and feeds the AGC signal back to the above-described tuner 21.

FIG. 5 shows an internal structure of the AGC circuit 22.

In FIG. 5, a data frame detection circuit 221 detects as to whether or not the frame sync shown in FIG. 3 is detected at predetermined intervals from the demodulation signal that is obtained by eliminating the pilot component at the above-described subtractor 29, and supplies a frame stabilization detection signal which assumes a logical "1" when the frame sync is detected at predetermined intervals and assumes a logical "0" when the frame sync is not detected at the predetermined intervals, each of a selector 222 and a header packet detection circuit 223. In other words, the data frame detection circuit 221 functions as a binary symbol area stable detection means which detects as to whether or not a state that the header packet HDP as the binary symbol area is stably obtained has been attained.

When the frame stabilization detection signal of logical "0" is supplied from the data frame detection circuit 221, the selector 222 supplies an average value ML of absolute values (absolute values obtained from all values which the multivalue simbol can assume) of the multivalue symbol in the data packet DP to a subtractor 225 as a reference level V. When, on the other hand, the frame stabilization detection signal of logical "1" is supplied, the selector 222 supplies an absolute value HL of the binary symbol in the header packet HDP to the subtractor 225 as the reference level V.

In other words, the selector 222 supplies the average value ML of the absolute values of the multivalue symbol when the header packet HDP as the binary symbol area is not obtained stably at the initial stage of the demodulation, and supplies the absolute value HL of the binary symbol when the state that the header packet HDP is stably detected is attained.

If the header packet HDP as the binary symbol area is made up of binary symbols {-5, 5}, then the value "5" constitutes the above-described level HL. If the data packet DP is made up of 16 value symbols of {-15, -13, -11, -9, -7, -5, -3, -1, 1, 3, 5, 7, 9, 11 ,13, 15}, then the average value of the absolute values of the symbols becomes "8", and the value "8" is used as the above-described ML.

An absolute value calculating circuit 224 supplies an absolute value demodulation signal, which is obtained by detecting the absolute value of the above-described demodulation signal, to a subtractor 225.

The subtractor 225 supplies a signal obtained by subtracting the above-described reference level V from the absolute value demodulation signal, to a selector 226, as a level difference signal G.

During the period in which the frame stabilization detection signal of logical "0" is supplied from the data frame detection circuit 221, the header packet detection circuit 223 supplies a pause signal of logical "1" to the selector 226. In the period in which the frame stabilization detection signal of logical "1" is supplied from the data frame detection circuit 221, the header packet detection circuit 223, on the other hand, performs a detection as to whether or not the header packet HDP shown in FIG. 3 is detected from the above-described demodulation signal. During the period in which the header packet HDP is not detected, the header packet detection circuit 223 supplies a pause signal of logical "0", to the selector 226, and during the period in which the header packet HDP is detected, it supplies a pause signal of logical "1" to the selector 226.

In other words, the header packet detection circuit 223 constitutes a binary symbol area detection means which starts the detection operation of the header packet HDP as the binary symbol area when a state that the header packet HDP as the above-described binary symbol area is stably detected from the above-described demodulation signal is attained.

During the period in which the pause signal of logical "0" is supplied, the selector 226 supplies a zero (0) level signal to the accumulating adder 227, and during the period in which the pause signal of logical "1" is supplied, it supplies the above-described level difference signal G to the accumulating adder 227. The accumulating adder 227 supplies an accumulated signal, which is obtained by accumulatively adding the signal supplied from the above-described selector 226, to a low pass filter LPF 228. The LPF 228 in turn performs a D/A conversion of the accumulated signal, and supplies its average signal to the tuner 21 shown in FIG. 2 as the AGC signal.

With the structure described above, when the header packet HDP as the binary symbol area shown in FIG. 3 is not stably obtained at the initial stage of the demodulation, the AGC circuit 22 generates an AGC signal which is based on a difference between the absolute value of the demodulation signal corresponding to the header packet and the average value ML of the absolute values of the multivalue symbol in the data packets DP. When, on the other hand, the header packet HDP as the binary symbol area shown in FIG. 3 is stably obtained, the AGC circuit 22 generates an AGC signal which is based on a difference between the absolute value of the demodulation signal corresponding to the header packet and the absolute value HL of the binary symbol in the data packets DP.

In other words, as shown in FIG. 3, the symbols formed in the header packet HDP are binary, and set independently of the coded information data. Hence, it can be estimated that the absolute value of the signal level of the demodulation signal during the period of header packet HDP as the binary symbol area equals the absolute value HL of the above-described binary symbol. However, if the signal level of the demodulation signal fluctuates by the effect of the transmission loss of the transmission media 15, for example, the demodulation signal will have a value shifted from the above described absolute value HL by an amount of the transmission loss.

Therefore, by the AGC circuit 22, the automatic gain control (AGC) for the tuner 21 is performed by an AGC signal obtained by subtracting (at the subtractor 225) the above described absolute value HL from the demodulation signal corresponding to the header packet HDP as the binary symbol area. With the AGC circuit 22 having this configuration, an AGC signal that is not affected by the transmitted coded information data, so that a stable AGC operation is surely performed.

In the foregoing description, the embodiment has been explained by way of a system of 16 value VSB modulation as an example of multivalue digital modulation systems. However, the multivalue demodulation is not limited to the described 16 value VSB modulation. For example, the system according to the present invention can be constructed in the similar manner when QAM (quadrature amplitude modulation) or QPSK (quadrature phase shift keying) is adopted.

Furthermore, although the header packet HDP part in the data frame format shown in FIG. 3, is provided as the binary symbol area, the provision of the header packet HDP part as the binary symbol area is not limitative. An essential point is to provide the binary symbol area, that is constituted by binary symbols only, in a periodic manner.

For the scheme described above, the system will be structured that the header packet detection circuit 305 and 223 respectively shown in FIGS. 4 and 5 detect the binary symbol area from the above described demodulation signal, and supply a pause signal of logical "1" to the selectors 307 and 226 respectively, when the binary symbol area is detected.

Furthermore, since the data frame detection circuits 303 and 221 respectively shown in FIGS. 4 and 5 have the same function, one of these data frame detection circuits 303 and 221 may be used commonly. Additionally, since the header packet detection circuits 305 and 223 respectively shown in FIGS. 4 and 5 have the same function, one of these header packet detection circuits 305 and 223 may be used commonly.

In short, it is sufficient to realize a structure in which: the information data to be transmitted is converted to a multivalue symbol sequence; a binary symbol area consisting of binary symbols is added to the multivalue symbol sequence in a periodic manner; a multivalue digital modulation signal, which is obtained by executing a multivalue digital modulation to a signal obtained by the addition of the binary symbol area to the multivalue symbol sequence, is transmitted; the binary symbol area is detected from a demodulation signal, which is obtained by performing a demodulation process corresponding to the multivalue digital modulation to an IF signal obtained by a frequency conversion of the transmitted multivalue digital modulation signal; and a gain control of the IF signal is performed based on a signal level of the demodulation signal obtained during a period of detection of the binary symbol area.

As specifically described in the foregoing, in the multivalue digital transmission system according to the present invention, the information data to be transmitted is converted to a multivalue symbol sequence, a multivalue digital modulation is effected to a signal obtained by adding a binary symbol area which does not depend on the information data to the multivalue symbol sequence and the modulated signal is transmitted, and a gain adjustment of an IF signal is performed based on a signal level of the demodulation signal which is obtained in a period when the binary symbol area is detected from a demodulation signal obtained by demodulating the IF signal produced by a conversion of the transmitted multivalue digital modulation signal.

The present invention has been described above with reference to the preferred embodiment. It will be understood that a person with ordinary skill in the art can make various modifications and variations. All of the modifications and variations are included in the scope of claims of the invention.

What is claimed is:

1. A multivalue digital transmission system comprising:
   a multivalue modulator which converts information data to be transmitted into a multivalue symbol sequence consisting of multivalue symbols, adds a binary symbol area consisting of binary symbols to the multivalue symbol sequence in a periodic manner, and obtains a multivalue digital modulation signal by executing a multivalue digital modulation to a signal obtained by adding the binary symbol area to the multivalue symbol sequence;
   a tuner for converting the multivalue digital modulation signal into an Intermediate Frequency (IF) signal at a gain according to an Automatic Gain Control (AGC) signal;
   a demodulator for demodulating the IF signal by a demodulation process corresponding to the multivalue digital modulation to produce a demodulation signal;
   an AGC circuit for detecting the binary symbol area from the demodulation signal and for producing the AGC signal based on a signal level of the demodulation signal obtained during a period of detection of the binary symbol area; and
   pilot signal eliminating means including:
      polarity detection means for detecting a polarity of the demodulating signal and producing a multiplication coefficient which has a value of "1" when the demodulation signal has a positive polarity and a value of "−1" when the demodulating signal has a negative polarity;
      binary symbol area stabilization detecting means for determining if the binary symbol area is obtained stably;
      binary symbol area detection means for detecting the binary symbol area from the demodulation signal;
      means for producing, as a superposed pilot signal, the demodulation signal obtained during a detection period of the binary symbol when the binary symbol area is not obtained stably and producing, as the superposed pilot signal, a signal obtained by subtracting a product of the multiplication coefficient and an absolute value of the binary symbol from the demodulation signal when the binary symbol area is obtained stably;
      an accumulating adder for accumulatively adding the superposed pilot signal and producing a pilot component signal; and
      a subtractor for subtracting the superposed pilot signal from the demodulation signal.

2. The multivalue digital transmission system as claimed in claim 1, wherein the AGC circuit includes:
   an absolute value computing circuit for computing an absolute value of the modulation signal to produce an absolute value demodulation signal;
   binary symbol area stabilization detecting means for determining if the binary symbol area is obtained stably;
   a subtractor for producing a level difference signal by subtracting an average value of absolute values of the multivalue symbol from the absolute value demodulation signal when the binary symbol area is not obtained stably, and for producing the level difference signal by subtracting an absolute value of the binary symbol from the absolute value demodulation signal when the binary symbol area is obtained stably;
   binary symbol area detection means for detecting the binary symbol area from the demodulation signal; and
   means for producing the AGC signal by accumulatively adding the level difference signal obtained during a period when the binary symbol area is detected.

3. The multivalue digital transmission system as claimed in claim 2, wherein the binary symbol area stabilization detection means further includes means for detecting a frame sync from the demodulation signal, and determines if the binary symbol area has been obtained stably when the frame sync is detected at predetermined periodic intervals.

4. The multivalue digital transmission system as claimed in claim 1, wherein the binary symbol area stabilization detection means further includes means for detecting a frame sync from the demodulation signal, and determines if the binary symbol area has been obtained stably when the frame sync is detected at predetermined periodic intervals.

5. A demodulating apparatus in a multivalue digital transmission system demodulating a multivalue digital modulation signal which is obtained by:

converting information data to be transmitted into a multivalue symbol sequence including multivalue symbols:

adding a binary symbol area consisting of binary symbols to the multivalue symbol sequence in a periodic manner; and executing a multivalue digital modulation to a signal obtained by the addition of the binary symbol area to the multivalue symbol sequence, the demodulating apparatus comprising:

a tuner for converting the multivalue digital modulation signal into an Intermediate Frequency (IF) signal at a gain according to an Automatic Gain Control (AGC) signal;

a demodulator for demodulating the IF signal by a demodulation process corresponding to the multivalue digital modulation to produce a demodulation signal; and an AGC circuit for detecting the binary symbol area from the demodulation signal and for producing the AGC signal based on a signal level of the demodulation signal obtained during a period of detection of the binary symbol area: and pilot signal eliminating means including:
 polarity detection means for detecting a polarity of the demodulating signal and producing a multiplication coefficient which has a value of "1" when the demodulation signal has a positive polarity and a value of "−1" when the demodulating signal has a negative polarity;
 binary symbol area stabilization detecting means for determining if the binary symbol area is obtained stably;
 binary symbol area detection means for detecting the binary symbol area from the demodulation signal;
 means for producing, as a superposed pilot signal, the demodulation signal obtained during a detection period of the binary symbol when the binary symbol area is not obtained stably and producing, as the superposed pilot signal, a signal obtained by subtracting a product of the multiplication coefficient and an absolute value of the binary symbol from the demodulation signal when the binary symbol area is obtained stably;
an accumulating adder for accumulatively adding the superposed pilot signal and producing a pilot component signal; and
a subtractor for subtracting the superposed pilot signal from the demodulation signal.

6. The demodulating apparatus as claimed in claim 5, wherein the AGC circuit includes:

an absolute value computing circuit for computing an absolute value of the modulation signal to produce an absolute value demodulation signal;

binary symbol area stabilization detecting means for determining if the binary symbol area is obtained stably;

a subtractor for producing a level difference signal by subtracting an average value of absolute values of the multivalue symbol from the absolute value demodulation signal when the binary symbol area is not obtained stably, and for producing the level difference signal by subtracting an absolute value of the binary symbol from the absolute value demodulation signal when the binary symbol area is obtained stably;

binary symbol area detection means for detecting the binary symbol area from the demodulation signal; and means for producing the AGC signal by accumulatively adding the level difference signal obtained during a period in which the binary symbol area is detected.

7. The multivalue digital transmission system as claimed in claim 6, wherein the binary symbol area stabilization detection means further includes means for detecting a frame sync from the demodulation signal, and determines if the binary symbol area has been obtained stably when the frame sync is detected at predetermined periodic intervals.

8. The multivalue digital transmission system as claimed in claim 5, wherein the binary symbol area stabilization detection means further includes means for detecting a frame sync from the demodulation signal, and determines if the binary symbol area has been obtained stably when the frame sync is detected at predetermined periodic intervals.

* * * * *